United States Patent
Lin et al.

(10) Patent No.: US 9,508,845 B1
(45) Date of Patent: Nov. 29, 2016

(54) LDMOS DEVICE WITH HIGH-POTENTIAL-BIASED ISOLATION RING

(71) Applicant: Freescale Semiconductor, Inc., Austin, TX (US)

(72) Inventors: Xin Lin, Phoenix, AZ (US); Hongning Yang, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/822,122

(22) Filed: Aug. 10, 2015

(51) Int. Cl.
  *H01L 29/78* (2006.01)
  *H01L 29/06* (2006.01)
  *H01L 29/10* (2006.01)
  *H01L 29/66* (2006.01)

(52) U.S. Cl.
  CPC ....... *H01L 29/7823* (2013.01); *H01L 29/0623* (2013.01); *H01L 29/0634* (2013.01); *H01L 29/0653* (2013.01); *H01L 29/0696* (2013.01); *H01L 29/1095* (2013.01); *H01L 29/66659* (2013.01); *H01L 29/66681* (2013.01)

(58) Field of Classification Search
  CPC ........... H01L 29/0615; H01L 29/0634; H01L 29/7835; H01L 29/1095; H01L 29/0878
  See application file for complete search history.

(56) References Cited

U.S. PATENT DOCUMENTS

| | | | |
|---|---|---|---|
| 6,882,023 B2 | 4/2005 | Khemka et al. | |
| 8,247,869 B2 | 8/2012 | Yang et al. | |
| 8,278,710 B2 | 10/2012 | Khemka et al. | |
| 8,541,862 B2 | 9/2013 | Yang et al. | |
| 8,652,930 B2 | 2/2014 | Yang et al. | |
| 8,748,981 B2 | 6/2014 | Yang et al. | |
| 8,772,871 B2 | 7/2014 | Yang et al. | |
| 8,853,780 B2 | 10/2014 | Yang et al. | |
| 9,048,132 B2* | 6/2015 | Ko | H01L 29/66659 |
| 2007/0054464 A1 | 3/2007 | Zhang | |
| 2010/0025765 A1 | 2/2010 | Yang et al. | |
| 2014/0001545 A1 | 1/2014 | Yang et al. | |
| 2014/0110814 A1 | 4/2014 | Lin et al. | |

OTHER PUBLICATIONS

S. J. C. H. Theeuwen et al., "LDMOS Technology for RF Power Amplifiers", IEEE Transactions on Microwave Theory and Techniques, May 8, 2012, 9 pages.

* cited by examiner

*Primary Examiner* — Quoc Hoang

(57) ABSTRACT

An LDMOS device implements a substrate having a buried isolation layer, a first well region that incorporates two stacked sub-regions to provide a PN junction with a RESURF effect, and a second well region laterally offset from the first well region. A source region is formed in one of the well regions and a drain region is formed in the other well region. An extension region is disposed immediately adjacent to the first well region and laterally distal to the second well region. An extension biasing region is formed at least partially within the extension region, and is separated from the first well region by a portion of the extension region. One or more metallization structures electrically couple the extension biasing region to the one of the source/drain region in the second well region. A gate structure at least partially overlaps both well regions.

20 Claims, 11 Drawing Sheets

LDMOS DEVICE WITH HIGH-POTENTIAL-BIASED ISOLATION RING

BACKGROUND

1. Field of the Disclosure

The present disclosure relates generally to semiconductor devices and, more particularly, to laterally diffused metal oxide silicon (LDMOS) transistors.

2. Description of the Related Art

Laterally diffused metal-oxide-semiconductor (LDMOS) transistor devices frequently are used as power transistors in automotive applications and other high voltage/high current implementations due to their compatibility with many complementary MOS (CMOS) fabrication processes. LDMOS devices utilize a drift region between the channel region and the drain region. The PN junctions of the body and drift region can lead to a relatively low breakdown voltage (BVdss). A reduced surface field (RESURF) structure often is employed to deplete the drift region in both vertical and lateral directions, thereby reducing the electric field in the PN junctions surrounding the drift region and thus raising the breakdown voltage (BVdss) of the device. A LDMOS device also may employ a "double RESURF" structure, in which the drift region contains both n-type and p-type regions, and which provides for the depletion of the two regions and the reduction of the electric field in the related junction areas. Double RESURF structures typically apply the drain voltage to isolation regions in order to deplete both the n-type and p-type regions. LDMOS devices often utilize a buried isolation layer to achieve high-side configurations, and biasing the isolation regions at the drain voltage increases the field stress between the body of the LDMOS device and the buried isolation layer. Breakdown thus may instead occur between the body and the buried isolation layer, thereby limiting the breakdown voltage.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
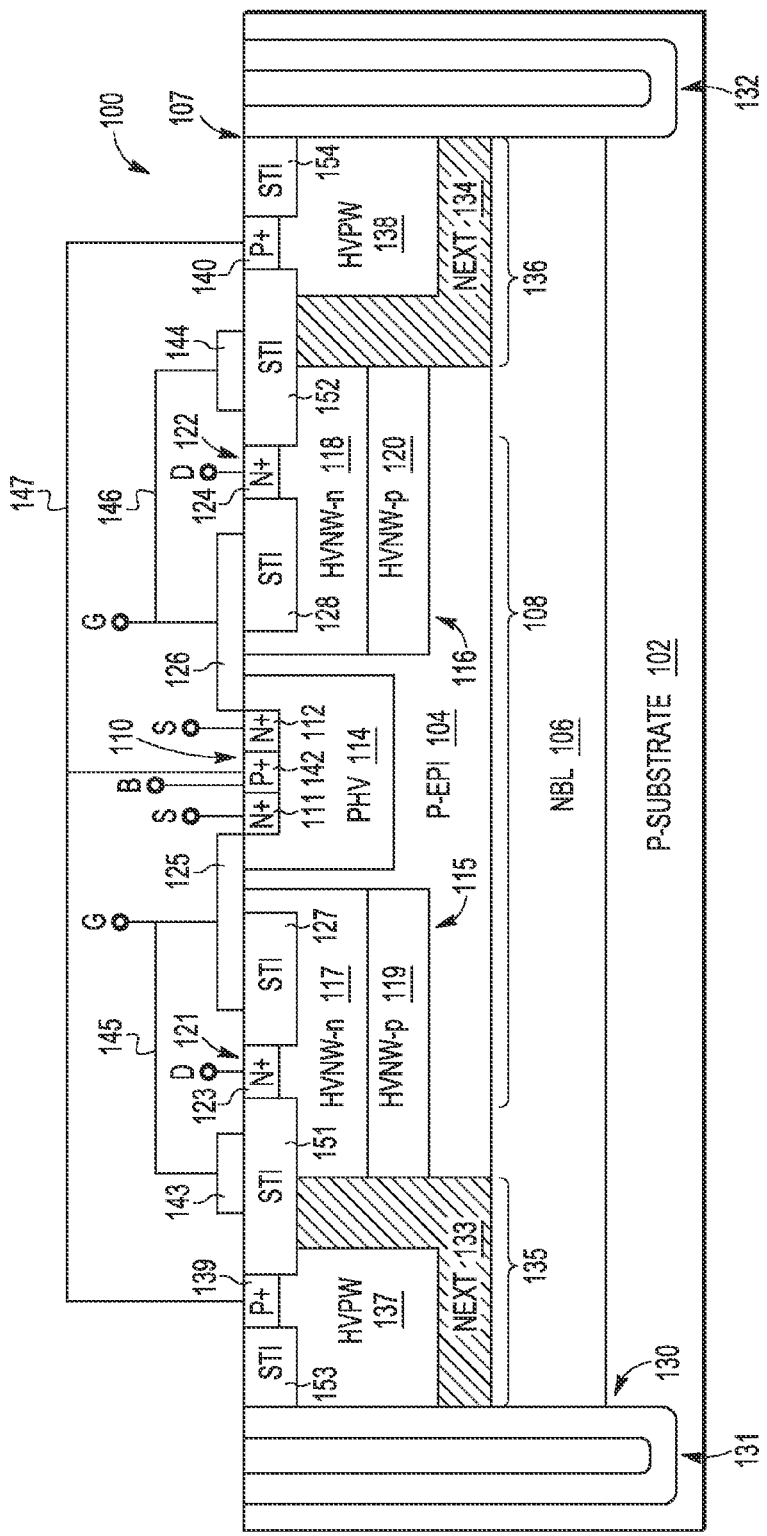
FIG. 1 is a cross-section view of an n-channel LDMOS device utilizing deep trench isolation (DTI) structures in accordance with some embodiments.

FIGS. 1-18 illustrate example LDMOS devices having improved breakdown voltage BVdss and the capability to operate in a high-side configuration, as well as example methods for their fabrication. The LDMOS devices described herein may find beneficial utilization in any of a variety of high-voltage/high-current electronic apparatuses, including, but not limited to, electronic devices used in automotive, aerospace, and industrial/scientific/medical (ISM) applications. An LDMOS device implements a substrate having a first conductivity type (e.g., a p-type conductivity). The substrate includes a buried isolation layer having a second, opposite, conductivity type (e.g., an n-type conductivity). The substrate further includes a first well region that incorporates two stacked sub-regions of opposite conductivity types to provide a PN junction with a reduced surface field (RESURF) effect and a second well region laterally offset from the first well region having the RESURF PN junction. A source region is formed in one of the two well regions and a drain region is formed in the other of the two well regions. An extension region having the second conductivity type is disposed immediately adjacent to the first well region and laterally distal to the second well region. That is, the extension region is formed outside of a device operational region defined by the lateral extent of the channel formed between the source region and the drain region during operation of the device. The extension region extends from the surface of the substrate to the buried isolation layer. An extension biasing region having the first conductivity type is formed at least partially within the extension region, and is separated from the first well region by a portion of the extension region. One or more metallization structures electrically couple the extension biasing region to the one of the source region or drain region formed in the second well region. The LDMOS device further includes a gate structure disposed over the semiconductor surface such that the gate structure at least partially overlaps both well regions.

During operation of the LDMOS device, the extension region is coupled to the highest potential terminal of the LDMOS device via the well region having the RESURF PN junction and the extension biasing region is coupled to the lowest potential terminal of the LDMOS device. The extension region thus links the top layer of the first well region to the buried isolation layer. Such a link region can be depleted by the extension biasing region and the RESURF layer of the first well region when the top layer of the first well region is biased with high potential, which improves the breakdown voltage (BVdss) while remaining a relatively low on-resistance (Rdson).

In an n-channel LDMOS (NLDMOS) configuration, the drain region is formed in the first well region and the source region is formed in the second well region, with the second well region forming the body region. Thus, the buried isolation layer is linked to the drain terminal via the extension region and biased with a high potential, and the extension biasing region is electrically linked or shorted to the source terminal and biased with a low potential, and the top layer of the first well region serves as the drift region for the NLDMOS device. Further, in an NLDMOS configuration, a conductive flap structure composed of highly-doped polysilicon or other conductive material may be formed on top of the shallow trench isolation above the junction between the first well region and the extension region, with the conductive flap structure electrically coupled to the gate structure so as to generate an electrical field during operation of the LDMOS device that aids in the depletion of the extension region, and thus facilitates a potential drop between the buried isolation region and the drift region.

In a p-channel LDMOS (PLDMOS) configuration, the source region is formed in the first well region and the drain region is formed in the second well region, with the top layer of the first well region forming the body region. Thus, the buried isolation layer is linked to the body region via the extension region and biased with a high potential and the extension biasing region is electrically linked or shorted to the drain terminal and biased with a low potential. Accordingly, in the breakdown operation the extension biasing region and the RESURF layer of the first well region deplete the extension region, and thus enables a potential drop in the buried isolation layer from the body region.

Various terms of orientation, such as "above," "below," "bottom," "top," and "lateral" are used herein to describe spatial relationships between different elements. However, these terms are not intended to imply a particular spatial orientation relative to a gravitational direction or other external fixed reference point, but rather are used in reference to the particular orientation presented in the drawing associated with the corresponding description. Further, the terms "first," "second," "third," and the like are used in the description to distinguish between somewhat similar elements, and is not intended to specify a particular spatial arrangement, sequence, or chronological order unless otherwise noted.

For ease of illustration, examples and embodiments are described in the context of semiconductor devices formed using silicon (Si) as a semiconductor material. However, the techniques described herein are not limited to this context, but instead may employ any of a variety of semiconductor materials, such as SiGe, GaN and Si, SiGe and GaAs, GaAs and Ge, Si and $Si_{1-y}C_y$, SiC and AN, SiC and BP, InGaN, and various other type IV, II-V and II-VI compounds and combinations thereof. Moreover, semiconductor devices with a conductive gate electrode positioned over a dielectric or other insulator may be considered metal-oxide-semiconductor (MOS) devices, despite the lack of a metal gate electrode and an oxide gate insulator. Accordingly, the terms metal-oxide-semiconductor and the abbreviation "MOS" are used herein even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations. Moreover, although described below in connection with n-channel and p-channel LDMOS devices, the disclosed devices are not limited to any particular transistor configuration. Rather, one or more of the features of the disclosed devices may be applied to other device configurations, including, for instance, bipolar transistors. Similarly, the structural arrangements are also not limited to any one particular type of RESURF configuration. The disclosed devices may have varying RESURF structures, including single, double, or other RESURF structural arrangements, each of which may be referred to herein as a "RESURF transistor."

For convenience of description and without any intended limitation, structures and regions of LDMOS devices having specified conductivity types (e.g., n-type or p-type) are described and illustrated herein. The disclosed devices are not limited to the specified conductivity types. Rather, other types of devices may be provided by, for example, substitution of semiconductor regions or doping processes of opposite conductivity type. Thus, for example, each semiconductor region, layer or other structure in the examples described below may have a conductivity type (e.g., n-type or p-type) opposite to the type identified in the examples below.

FIG. 1 illustrates a schematic cross-section view of an n-channel LDMOS device 100 in accordance with at least one embodiment. The device 100 includes a lightly doped p-type semiconductor substrate 102 having a primary surface 107 that defines a "lateral" direction as referenced herein. The substrate 102 includes a p-type epitaxial layer 104 of the same conductivity type (e.g., p-type). The device 100 alternatively or additionally may include non-epitaxial layers in which one or more device regions are formed. The structural, material, and other characteristics of the semiconductor substrate 102 may vary from the example shown, and may include, for instance, one or more semiconductor and/or non-semiconductor layers, a silicon-on-insulator (SOI) construction, and the like. The substrate 102 further includes an n-type buried isolation layer (NBL) 106 formed below the primary surface 107 of the substrate 102 within the epitaxial layer 104. The NBL 106 extends under a device operational region 108 of the device 100 to act as a barrier or isolation layer separating the device operational region 108 from the rest of the substrate and thus facilitates high-side capability. The NBL 106 is laterally terminated by deep trench isolation (DTI) structures 131, 132 extending from the primary surface 107 in respective regions outside of the device operational region 108, which together with the NBL 106 form an isolation structure 130 for the device 100.

In the depicted example, the device 100 includes a symmetric double-gate double RESURF configuration. A source region 110 includes highly-doped n-type source contact regions 111, 112 disposed in a p-type body well region 114, which may be formed via, for example, a p-type high voltage (PHV) implant process and thus also referred to herein as PHV region 114. Well regions 115 and 116 are disposed at lateral offsets from the body well region 114; that is, to the left and right, respectively, of the body well region 114 in the orientation of the cross-section view depicted in FIG. 1. In the illustrated configuration, the well regions 115, 116 are configured for depletion during operation to establish a RESURF effect for improved breakdown performance. In particular, in the depicted embodiment each of the well regions 115, 116 is configured to achieve a double RESURF effect through the formation of vertical PN junctions. To this end, the well region 115 includes an n-type well sub-region 117 and a p-type well sub-region 119 disposed between the primary surface 107 and the NBL 106 and the well region 116 includes an n-type well sub-region 118 and a p-type well sub-regions 120 disposed between the primary surface 107 and the NBL 106. The n-type well sub-regions 117, 118 may be formed as high-voltage n-type wells (HVNW-n) extending from the primary surface 107, and the p-type well sub-regions 119, 120 may be formed by p-type doping of corresponding portions of the HVNW-n wells to attain a p-type concentration (HVNW-p). Sub-regions 117/118 and sub-regions 119/120 may be formed by, for example, separate implant processes using the same masks or different masks. Further, as illustrated the well regions 115, 116 may be formed so that a portion of the epitaxial layer 104 separates the well regions 115, 116 from the NBL 106. However, in other embodiments, the well regions 115, 116 may extend to the NBL 106 such that no portion of the epitaxial layer 104 remains between the well regions 115, 116 and the NBL 106.

Drain regions 121, 122 are disposed in or above the well regions 115, 116, respectively, at the primary surface 107 and heavily n-doped (n++) regions may be formed therein to create drain contact regions 123, 124, respectively. Gate structures 125, 126 are formed at the primary surface 107, with gate structures 125, 126 each comprising a gate dielectric (not shown) deposited or otherwise formed at the primary surface 107 and a conductive gate (e.g., having a polysilicon or metal composition) disposed on or above the gate dielectric. The gate structure 125 extends laterally between the source region 110 and the drain region 121 over at least a portion of the well region 115; that is, the gate structure 125 partially overlaps the well region 115, as well as partially overlapping the body well region 114. The edge of the gate structure 125 facing the drain region 121 is offset from the drain region 121 to isolate the gate structure 125 from the high voltages to be applied to the drain region 121. Further isolation may be achieved through the formation of a shallow trench isolation (STI) structure 127 between the gate structure 125 and the drain region 121 at the primary surface 107. The gate structure 126 may be similarly configured with respect to the drain region 122 and the source region 110, and likewise may include a STI structure 128 to provide further isolation between the drain region 122 and the gate structure 126. Further, the gate structures 125, 126 may include one or more dielectric sidewall spacers (not shown) and which may be configured as silicide blockers to prevent a silicide short along the primary surface 107.

Although FIG. 1 illustrates an example embodiment employing an undivided gate structure for gate structures 125, 126, in other embodiments the gate structures 125, 126 may be implemented using a split-gate configuration. To illustrate, the gate structure 125 may be implemented as two separate polysilicon gate structures electrically coupled to the same gate potential. One gate structure is formed so as to overlap at least a portion of the body well region 114 and at least a portion of the well sub-region 117 while separated from the STI structure 127. The other gate structure is formed above the STI region 127 and is dimensioned so as to be separated from the lateral edges of the STI region 127. The gate structure 126 may be similarly configured with respect to the body well region 114, the well sub-region 118, and the STI structure 128.

The source contact regions 111, 112 of the source region 110 are electrically connected to a source terminal (denoted "S") of the device 100 via the formation of one or more conductive plugs and metallization layers or structures (not shown) of the device 100. Similarly, the drain contact regions 123, 124, and the gate structures 125, 126 are connected to a drain terminal (denoted "D") and a gate terminal (denoted "G"), respectively, of the device 100 using one or more conductive plugs and other metallization layers or structures of the device 100. In this configuration, channels are formed in the PHV region 114 under the gate structures 125, 126, and drift regions are formed by the well sub-regions 117, 118 under the STI structures 127, 128, respectively. These drift regions are depleted during breakdown operation as facilitated by the RESURF layers provided by the well sub-regions 119, 120, respectively. As such, the well sub-regions 117, 118 act as drift regions and thus are also referred to herein as "drift regions 117, 118." Further, because the drift regions are defined by the drain regions 121, 122 and the source region 110 in between, the drain regions 121, 122 define the lateral extent of the device operational region 108.

The device 100 additionally includes one or more biasing structures to bias at least the NBL 106 of the isolation structure 130 at a voltage potential based on the highest potential of the terminals of the device 100. In the example of FIG. 1, the device 100 includes lightly-doped n-type extension (NEXT) regions 133, 134 extending from the semiconductor surface to the top surface of the NBL 106 in link regions 135, 136 that are laterally adjacent to, or otherwise outside of, the device operational region 108. The NEXT region 133 is immediately adjacent to (that is, in lateral contact with) the well sub-regions 117, 119 of the well region 115. Likewise, the NEXT region 134 is immediately adjacent to (in lateral contact with) the well sub-regions 118, 120 of the well region 116. The device 100 further includes p-type extension biasing regions 137, 138, disposed in the NEXT regions 133, 134, respectively, with the extension biasing regions 137, 138 comprising p-type well regions extending from the primary surface 107. In the illustrated embodiment, the extension biasing regions 137, 138 extend to a depth less than the depth of the corresponding NEXT region. However, in other embodiments, the extension biasing regions 137, 138 may extend as deep as, or even deeper than, the corresponding NEXT regions. The extension biasing regions 137, 138 may be formed via a high voltage p-type implantation process and thus are also referred to herein as "HVPW regions 137, 138." The HVPW regions 137, 138 are shorted or otherwise linked to the source (S) terminal of the device 100 via p+ contact regions 139, 140 formed in the respective HVPW region at the semiconductor surface, p+ contact region 142 formed between the n+ contact regions 111, 112 in the PHV region 114, and one or more metallization structures 147 (e.g., vias, plugs, traces) formed in the one or more metallization layers (not shown) of the device 100. The p+ contact region 142 further may be coupled to the body (B) terminal of the device 100.

Additionally, in some embodiments, the biasing structure can include conductive flap structures 143, 144 formed above the primary surface 107 and shorted or otherwise electrically coupled to the gate (G) terminal via metallization structures 145, 146, respectively. The conductive flap structure 143 is disposed over the junction between the drift region 117 and the NEXT region 133. Likewise, the conductive flap structure 144 is disposed over the junction between drift region 118 and the NEXT region 134. The conductive flap structures 143, 144 may be composed of polysilicon, metal, or other conductive materials or combinations thereof, and may be formed using the same or different processes used to form the gate structures 125, 126. Isolation between the device operation region 108 and the regions of the biasing structure may be achieved through the formation of, for example, an STI structure 151 between the drain contact region 123 and the p+ contact region 139, an STI structure 152 between drain region 122 and p+ contact region 140, an STI structure 153 between p+ contact region 139 and the DTI structure 131, and an STI structure 154 between p+ contact region 140 and the DTI structure 132.

As the device 100 comprises an n-channel LDMOS, in operation the drain (D) terminal is coupled to the highest voltage potential. The bias structure of the device 100 serves to electrically couple the NBL 106 to this highest voltage terminal of the device 100, that is, the drain (D) terminal, via the HVNW-n sub-regions 117, 118 and the NEXT regions 133, 134. Because the HVPW regions 137, 138 are tied to the source (S) or body (B) terminal and HVNW-p sub-regions 119 and 120 are connected with the PHV body region, they operate to generate an electric field that depletes the NEXT regions 133, 134, respectively, thereby facilitating certain voltage drop in regions 133 and 134, which leads to a lower potential on the NBL 106 compared to the drain (D) terminal. Further, because the flap structures 143, 144 are tied to the gate (G), the flap structures 143, 144 each forms an electric field that assists in the depletion of the corresponding HVNW-n region and the corresponding NEXT region. Both of these phenomena contribute to a reduction in potential of NBL 106 from the voltage applied to the drain (D) terminal and thus substantially increasing the breakdown voltage of the device 100.

Figure 2:
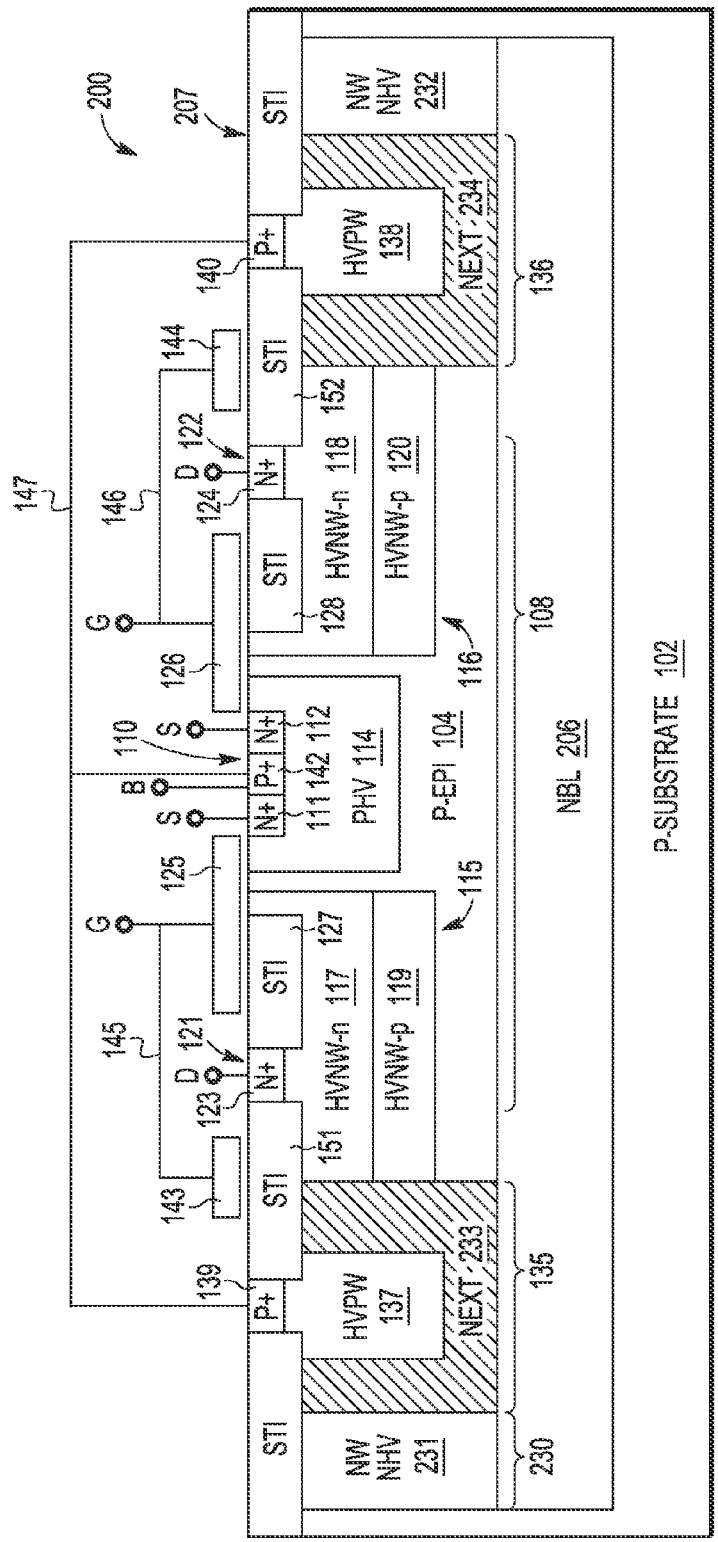
FIG. 2 is a cross-section view of an n-channel LDMOS device without DTI structures in accordance with some embodiments.

FIG. 2 illustrates a schematic cross-section view of an n-channel LDMOS device 200 in accordance with at least one embodiment. Device 200 primarily differs from device 100 in that an isolation structure 230 (analogous to the isolation structure 130 of device 100) of the device 200 includes n-type isolation wells 231, 232 (also commonly referred to as "sinkers") formed at the outer perimeter of, or otherwise distally adjacent to, NEXT regions 233, 234 (analogous to NEXT regions 133, 134 of device 100), respectively. The isolation wells 231, 232 extend from a primary surface 207 to the top surface of the NBL 206 (corresponding to the NBL 106 of FIG. 1), and may be formed via, for example, a n-type high voltage implantation process. In some embodiments, the isolation structure 230 may implement DTI structures in combination with the isolation wells 231, 232 to provide enhanced isolation.

Figure 3:
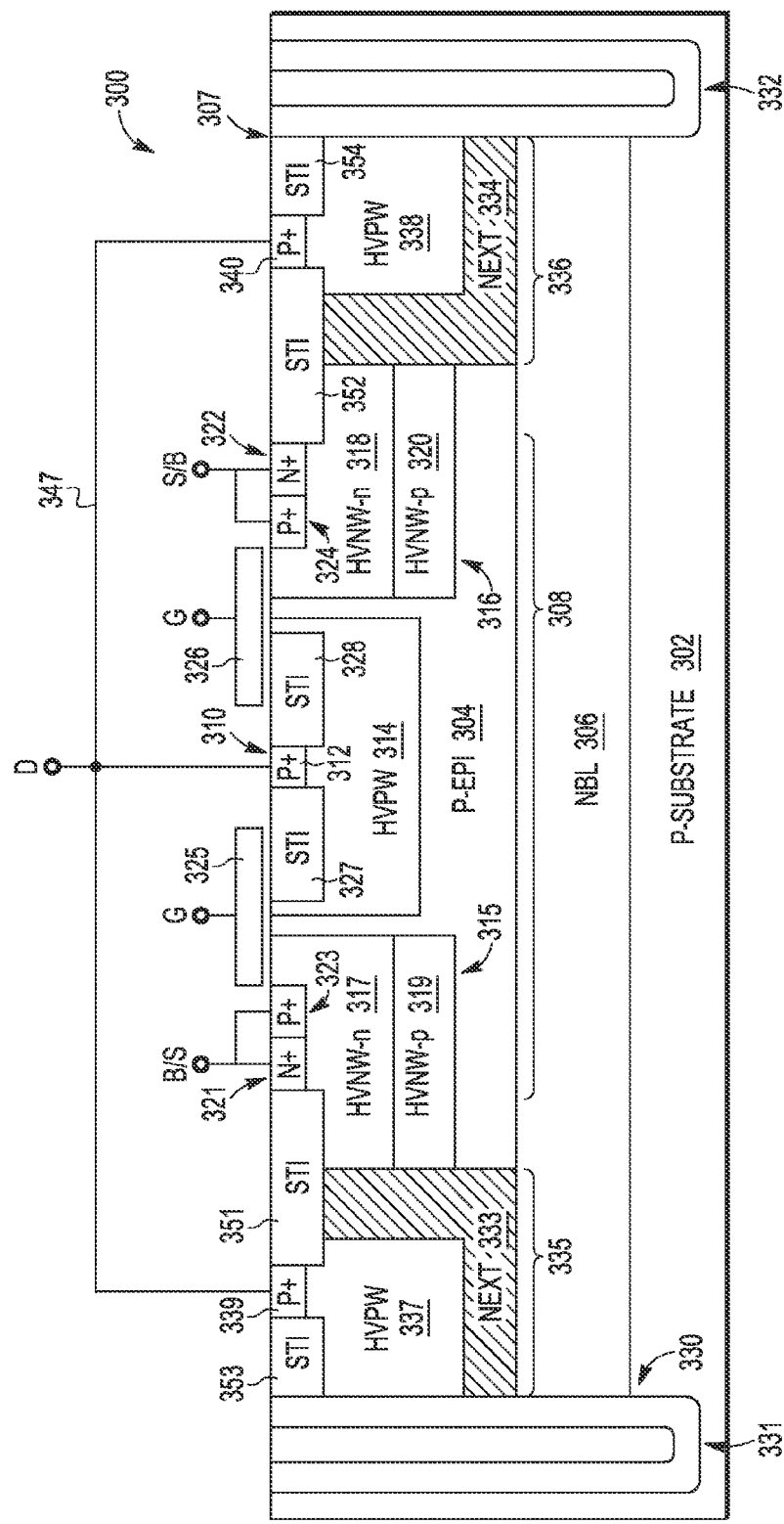
FIG. 3 is a cross-section view of a p-channel LDMOS device utilizing DTI structures in accordance with some embodiments.

FIG. 3 illustrates a schematic cross-section view of a p-channel LDMOS device 300 in accordance with at least one embodiment. The device 300 includes a lightly doped p-type semiconductor substrate 302 upon which a p-type epitaxial layer 304 is formed. The device 300 alternatively or additionally may include non-epitaxial layers in which one or more device regions are formed. As similarly noted above, the structural, material, and other characteristics of the semiconductor substrate 302 may vary from the example shown. The substrate 302 further includes an NBL 306 formed below a primary surface 307 of the substrate 302 and under the epitaxial layer 304, and extending under a device operational region 308 of the device 300. The NBL 306 is laterally terminated by DTI structures 331, 332 extending from the primary surface 307 in respective regions outside of the device operational region 308, which together with the NBL 306 form an isolation structure 330 for the device 300.

The device operational region 308 extends from the primary surface 307 to the NBL 306. As with the n-channel devices 100 and 200 of FIGS. 1 and 2, the p-channel device 300 can include a symmetric double-gate, but single RESURF configuration in the device operational region 308. A drain region 310 includes highly-doped p-type (p+) drain contact region 312 disposed in a p-type well region 314, which may be formed via, for example, a high voltage implant process. Well regions 315, 316 are disposed at lateral offsets from the well region 314 within the device operational region 308. The well region 315 includes an n-type well sub-region 317 and a p-type well sub-region 319 disposed between the primary surface 307 and the NBL 306 and the well region 316 includes an n-type well sub-region 318 and a p-type well sub-region 320 disposed between the primary surface 307 and the NBL 306. The n-type well sub-regions 317, 318 may be formed as high-voltage n-type wells (HVNW-n) extending from the primary surface 307, and the p-type well sub-regions 319, 320 may be formed through the p-type doping of corresponding portions of the HVNW-n wells to attain a p-type concentration (HVNW-p). Further, as illustrated the well regions 315, 316 may be formed so that a portion of the epitaxial layer 304 separates the well regions 315, 316 from the NBL 306. However, in other embodiments, the well regions 315, 316 may extend fully to the NBL 306.

Source/body regions 321, 322 are disposed in or above the well regions 315, 316, respectively, at the primary surface 307 and adjacent n+ and p+ regions may be formed in each of the HVNW-n well sub-regions 317, 318 to create source/body contact regions 323, 324, respectively. Gate structures 325, 326 are formed at the primary surface 307, with each comprising a gate dielectric (not shown) deposited or otherwise formed at the surface 307 and a conductive gate disposed on or above the gate dielectric. The gate structure 325 extends laterally between the drain region 310 and the source/body region 321 over at least a portion of the well region 315; that is, the gate structure 325 partially overlaps the well region 315. The edge of the gate structure 325 facing the drain region 310 is laterally offset from the drain region 310 to sustain a large voltage drop between the gate structure 325 and the drain region 310. Further isolation may be achieved through the formation of a shallow trench isolation (STI) structure 327 between the gate structure 325 and the drain region 310 at the surface 307. The gate structure 326 may be similarly configured with respect to the drain region 310 and the source/body region 322, and likewise may include a STI structure 328 to provide further isolation between the drain region 310 and the gate structure 326. Moreover, while FIG. 3 illustrates gate structures 325, 326 as monolithic gate structures, in other embodiments the gate structures 325, 326 may be implemented using a split-gate configuration as similarly described above with reference to the gate structures 125, 126 of FIG. 1.

The source contact regions 323, 324 of the source/body regions 321, 322 are electrically connected to a source terminal (denoted "S") of the device 300 via the formation of one or more conductive plugs and metallization layers or structures (not shown) of the device 300. In the depicted example, the body terminal (denoted "B") is shorted to the source terminal. The drain contact region 312 and the gate structures 325, 326 are connected to a drain terminal (denoted "D") and a gate terminal (denoted "G"), respectively, of the device 300 using one or more conductive plugs and other metallization layers or structures of the device 300. In this configuration, a channel is formed between the source/body region 321 and the drain region 310 in view of inversion of the n-type well sub-region 317 provided via the electric field generated by the gate structure 325, and a channel likewise is formed between the source/body region 322 and the drain region 310 in view of inversion of the n-type well sub-region 318 provided via the electric field generated by the gate structure 326. As such, the n-type well sub-regions 317, 318 act as body regions in this configuration and thus are also referred to herein as "body regions 317, 318." Further, because the channels are defined by the source/body regions 321, 322 and the drain region 310 in between, the source/body regions 321, 322 define the lateral extent of the device operational region 308.

As similarly described above with respect to devices 100 and 200, the device 300 likewise includes one or more biasing structures to bias the NBL 306 at a voltage potential based on the highest voltage of the terminals of the device 300. This biasing structure includes NEXT regions 333, 334 extending from the primary surface 307 to the top surface of the NBL 306 in link regions 335, 336 that are distally adjacent to, or otherwise outside of, the device operational region 308. The NEXT region 333 is immediately adjacent to (that is, in lateral contact with) the well region 315. Likewise, the NEXT region 334 is in lateral contact with the well region 316. The device 300 further includes p-type extension biasing regions 337, 338, disposed in the NEXT regions 333, 334, respectively, with the extension biasing regions 337, 338 comprising p-type well regions extending from the primary surface 307. In the depicted example, the extension biasing regions 337, 338 extend to a depth less than the depth of the corresponding NEXT region, while in other configurations the extension biasing regions 337, 338 may extend as deep as, or even deeper than, the NEXT regions 333, 334. The extension biasing regions 337, 338 may be formed via a high voltage p-type implantation process and thus are also referred to herein as "HVPW regions 337, 338." The HVPW regions 337, 338 are shorted or otherwise linked to the drain (D) terminal of the device 300 via p+ contact regions 339, 340 formed in the respective HVPW region at the semiconductor surface, the p+ contact region 312 of the drain region 310, and a metallization structure 347 formed in the one or more metallization layers (not shown) of the device 300.

Isolation between the device operation region 308 and the regions of the biasing structure may be achieved through the formation of, for example, an STI structure 351 between the source/body region 321 and the p+ contact region 339, an STI structure 352 between source/body region 322 and p+ contact region 340, an STI structure 353 between p+ contact region 339 and the DTI structure 331, and an STI structure 354 between p+ contact region 340 and the DTI structure 332.

As the device 300 comprises a p-channel LDMOS, in operation the source/body (S/B) terminal is coupled to the higher voltage and the drain is coupled to the lower voltage. The biasing structure of the device 300 serves to electrically couple the NBL 306 to the highest voltage terminal of the device 300 via the HVNW-n sub-regions 317, 318 and the NEXT regions 333, 334. Because the HVPW regions 337, 338 are tied to the drain (D) terminal and thus biased at the lowest voltage of the terminals of the device 300, and the HVPW regions 337, 338 are connected with the drift region 314. The HVPW regions 337, 338 and HVNW-p sub-regions 319 and 320 operate to deplete the NEXT regions 333, 334, respectively, thereby facilitating a potential drop along the HVNW-n regions 317, 318 and the NEXT regions 333, 334. As a result, the NBL 306 has a lower potential compared to the highest voltage applied to the terminals of the device 300.

Figure 4:
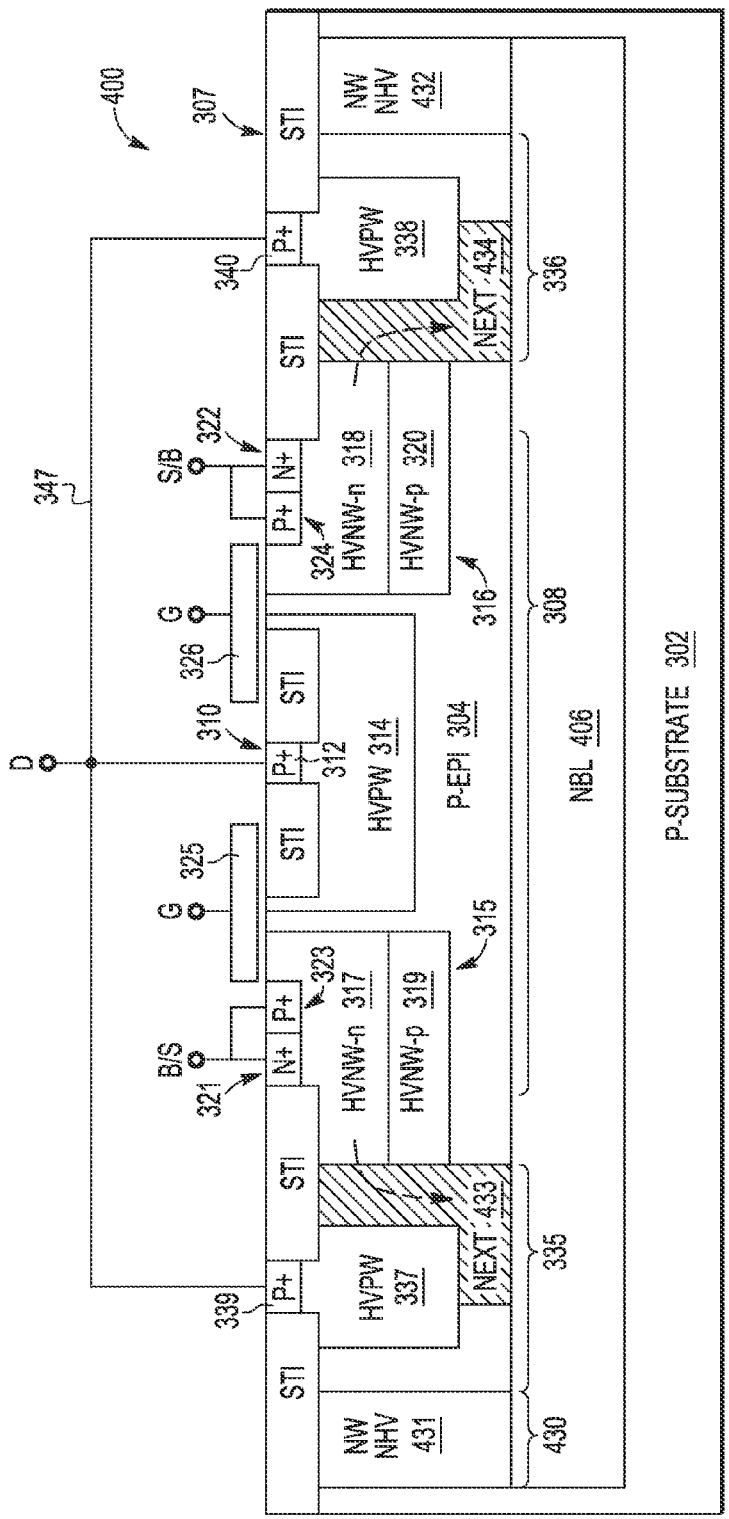
FIG. 4 is a cross-section view of a p-channel LDMOS device without DTI structures in accordance with some embodiments.

FIG. 4 illustrates a schematic cross-section view of a p-channel LDMOS device 400 in accordance with at least one embodiment. Device 400 differs from device 300 in that an isolation structure 430 (analogous to the isolation structure 330 of device 300) of the device 400 includes n-type isolation wells 431, 432 formed at the outer perimeter of, or otherwise distally adjacent to, NEXT regions 433, 434 (analogous to NEXT regions 333, 334 of device 300), respectively. The isolation wells 431, 432 extend from the primary surface 307 to the top surface of a NBL 406 (corresponding to the NBL 306 of FIG. 3), and may be formed via, for example, an n-type high voltage implantation process. In some embodiments, the isolation structure 430 may implement DTI structures in combination with the isolation wells 431, 432 to provide enhanced isolation.

FIGS. 5-14 schematically illustrate, via cross-sectional views, stages in a process for fabricating the LDMOS device 100 of FIG. 1 from a workpiece 500 in accordance with at least one embodiment of the present disclosure. For brevity, conventional semiconductor fabrication processes that may be utilized in the fabrication process (e.g., annealing after ion implantation or chemical/mechanical polishing after trench fill) are described only briefly herein, or omitted entirely. Further, although a particular non-limiting sequence of processing stages are described to facilitate understanding, this sequence represents but one example approach to fabricating the LDMOS device 100, and one skilled in the art will appreciate that certain acts may be performed in different orders in view of the teachings provided herein.

Figure 5:
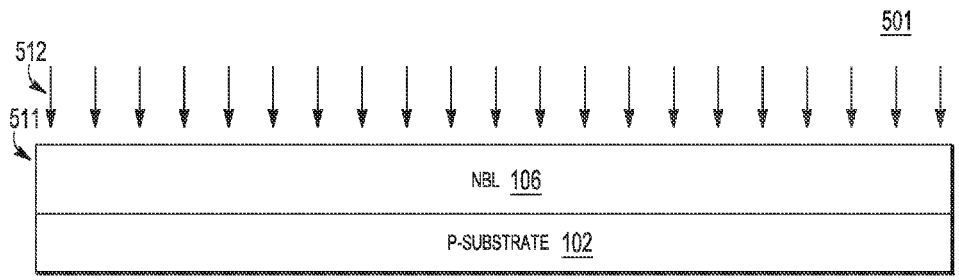
FIGS. 5-13 illustrate a sequence of cross-section views of a workpiece at different stages of a process for fabricating an n-channel LDMOS device in accordance with some embodiments.
Figure 6:
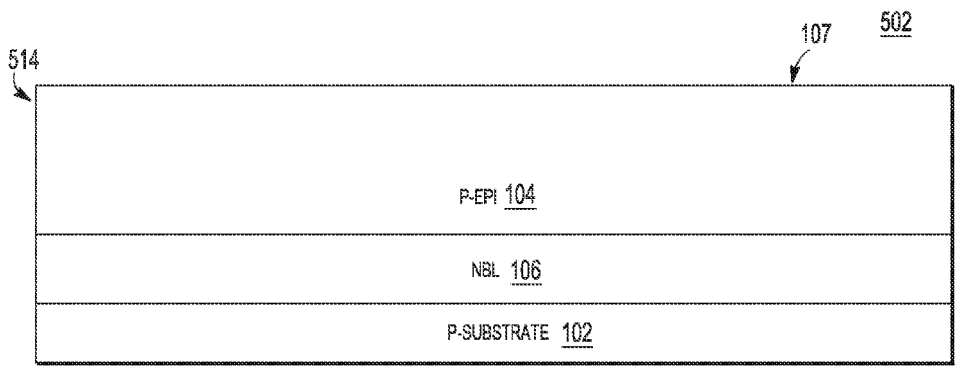

As illustrated by FIG. 5, at processing stage 501, starts with a lightly doped p-type semiconductor substrate 102. Alternatively, an initial p-type epitaxial layer may be grown on the heavily-doped p-type substrate 102. The substrate 102 may comprise a semiconductor of, for example, silicon or other type IV, II-IV, or II-VI, or organic semiconductor, or combinations thereof, and may be in the form of a single crystal or a polycrystalline, or of a layer that has been formed on another substrate (e.g., silicon-on-insulator (SOI). The NBL 106 then is formed in the lightly-doped p-type substrate 102 or an initial p-type epitaxial layer (not shown) via an ion-implantation process 512 using, for example, Arsenic (As) or Antimony (Sb) ion species. As illustrated by FIG. 6, at processing stage 502, a second p-type epitaxial layer 104 is grown on the lightly doped p-type substrate 102/NBL 106 of the workpiece 500 via an epitaxial growth process 514, and the top surface of the epitaxial layer 104 forms the primary surface 107. Alternatively, one or more p-type epitaxial layer may be grown as the epitaxial layer 104 and the NBL 106 then may be formed at a specified depth therein using a high-energy n-type implantation process. The NBL 106 may be doped to an approximate concentration in a range of about $1\times10^{17}$ cm$^{-3}$ to $1\times10^{19}$ cm$^{-3}$.

Figure 7:
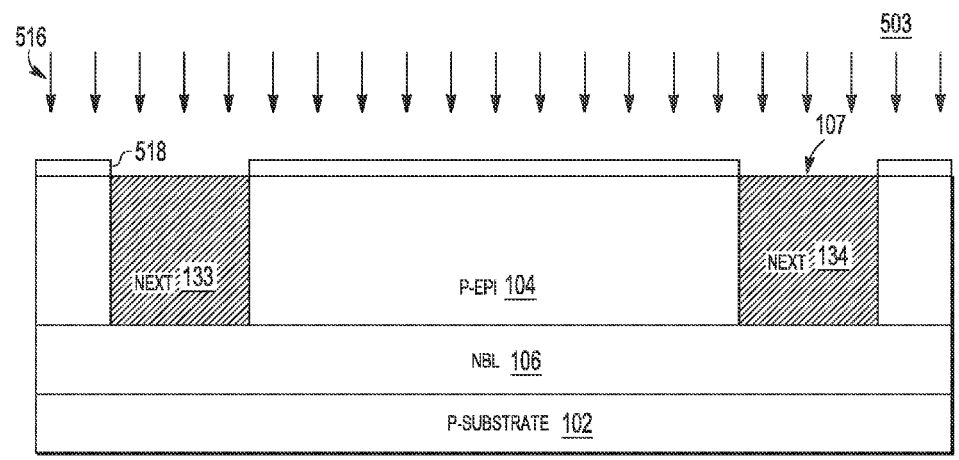

At processing stage 503 of FIG. 7, the NEXT regions 133, 134 are created in the epitaxial layer 104 via an n-type ion implantation process 516 or other doping process. As illustrated by FIG. 7, the lateral dimensions of the NEXT regions 133, 134 may be configured during the n-type ion implantation process 516 via one or more masks 518 comprising photo-resist, oxide, or other dopant-resistant material. The NEXT regions 133, 134 vertically extend from the primary surface 107 to the top surface of the NBL 106. The ion implantation process 516 may be performed at a voltage range of approximately 1 MeV-3 MeV and the NEXT regions 133, 134 may be doped using phosphorous (P) as a dopant species to an approximate concentration in a range of about $1\times10^{15}$ cm$^{-3}$ to $1\times10^{17}$ cm$^{-3}$. At processing stage 504 of FIG. 8, the mask 518 is removed from the workpiece 500 and a high-voltage p-type ion-implantation process 520 or other doping process is performed on the workpiece 500 using one or more masks 522 to form extension biasing (HVPW) regions 137, 138 at least partially in the NEXT regions 133, 134, respectively. The ion implantation process 520 may be performed at a voltage range of approximately 100 KeV-300 KeV using boron (B) as the dopant and the extension biasing regions 137, 138 may be doped to an approximate concentration in a range of about $5\times10^{15}$ cm$^{-3}$ to $5\times10^{17}$ cm$^{-3}$.

Figure 8:
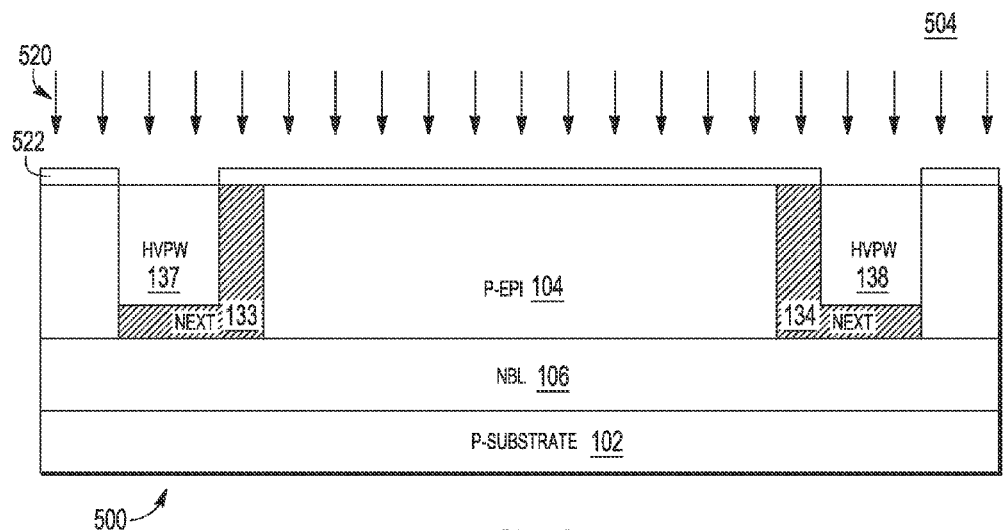
Figure 9:
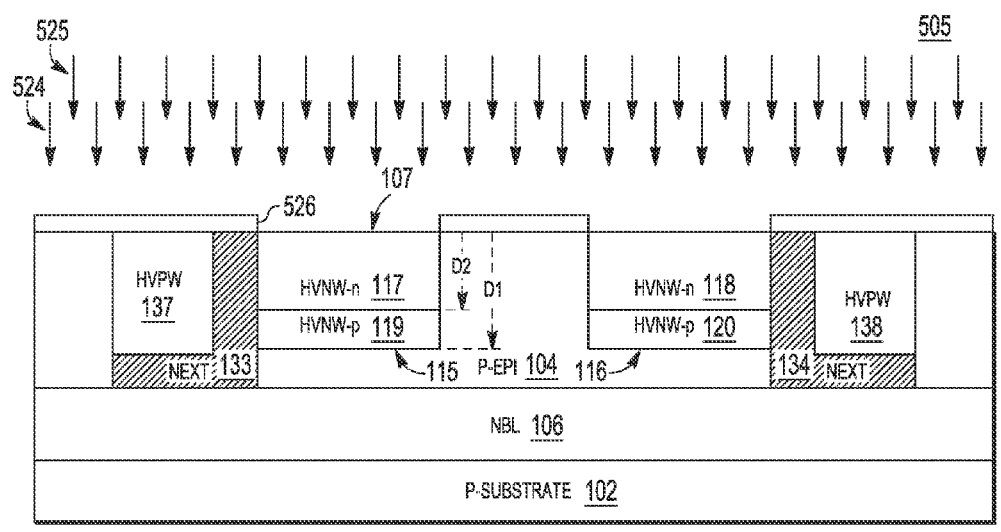

At processing stage 505 of FIG. 9, the mask 522 is removed from the workpiece 500 and the well regions 115, 116 are formed adjacent to the NEXT regions 133, 134, respectively. As similarly noted above, a RESURF structure may be formed in the well regions 115, 116 via the formation of HVNW-n sub-regions 117, 118 to a depth D2 of, for example, approximately 0.15-2.5 µm from the primary surface 107 using a high-voltage n-type ion-implantation process 524 at a concentration of approximately $5\times10^{15}$ cm$^{-3}$ to $5\times10^{17}$ cm$^{-3}$ and the formation of HVNW-p sub-regions 119, 120 in a region between depth D1 and depth D2 (e.g., between 0.15 and 3.5 µm) using a p-type ion implantation process 525 at a concentration of approximately $5\times10^{15}$ cm$^3$ to $5\times10^{17}$ cm$^{-3}$. One or more masks 526 may be used during the implantation processes 524, 525 so as to control the lateral dimensions of the well regions 115, 116. As illustrated by FIGS. 7, 8, and 9, the NEXT regions 133, 134, the HVPW regions 137, 138, and the well regions 115, 116 are configured via the corresponding masks so that the NEXT region 133 laterally contacts the well region 115, the NEXT region 134 laterally contacts the well region 116, and the extension biasing regions 137, 138 are laterally separated from the respective well regions 115 and 116 by a portion of the corresponding NEXT region 133, 134, thereby providing a link in each NEXT region from the corresponding well regions to the NBL 106, these links being depleted by the electric field generated by the HVPW regions and HVNW-p sub-regions during device operation.

Figure 10:
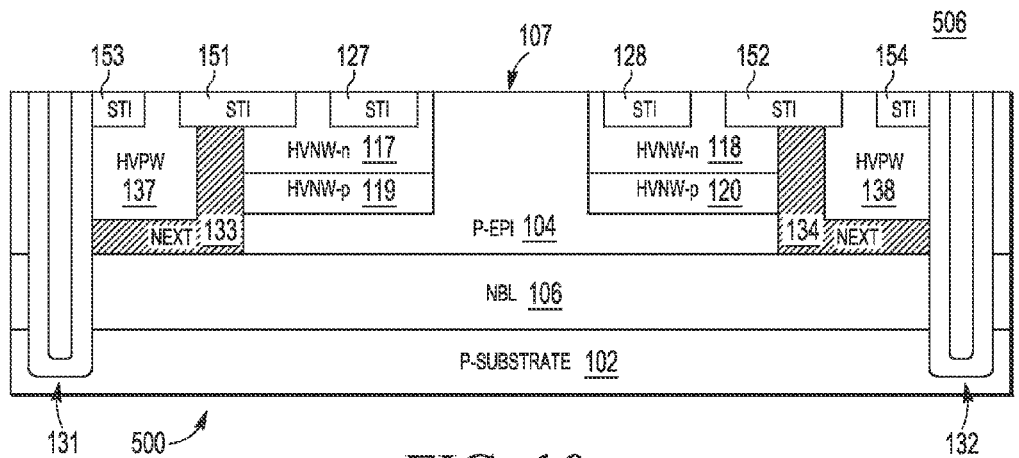
Figure 11:
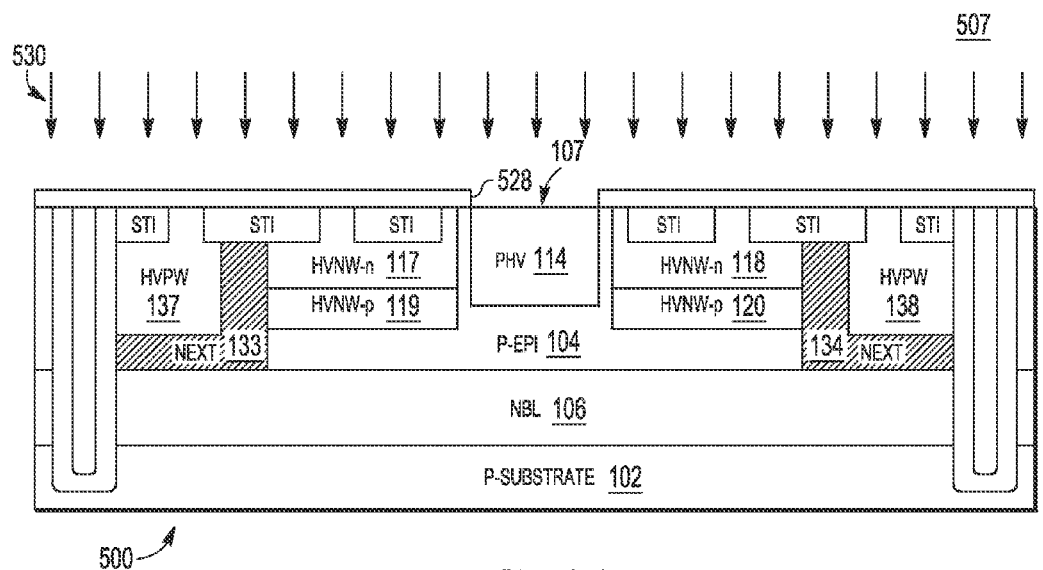

At processing stage 506 of FIG. 10, the mask 526 is removed from the workpiece 500 and the DTI structures 131, 132 and the STI structures 127, 128, 151, 152, 153, 154 are formed in the workpiece 500. The DTI structures 131, 132 may be formed using one or more etch processes to form corresponding deep trenches extending from the primary surface 107 in the workpiece 500 and the trenches then filled with, for example, an oxide sidewall layer and a polysilicon fill. The STI structures 127, 128, 151, 152, 153, 154 similarly may be formed through formation of shallow trenches extending from the primary surface 107 and then a fill process to fill the shallow trenches with oxide or other suitable material. Alternatively, the STI structures may be formed using a well-known local oxidation of silicon (LOCOS) process. A chemical/mechanical polishing (CMP) process may be performed after formation of these isolation structures to remove any masks or other temporarily materials formed at the primary surface 107 during the isolation structure formation process. At processing stage 507 of FIG. 11, a mask 528 is formed on the workpiece 500 and the PHV region 114 is formed at the primary surface 107 of the workpiece 500 using a high voltage p-type implantation process 530 at a concentration of approximately $5 \times 10^{15}$ cm$^{-3}$ to $1 \times 10^{18}$ cm$^{-3}$ in the presence of the mask 528.

Figure 12:
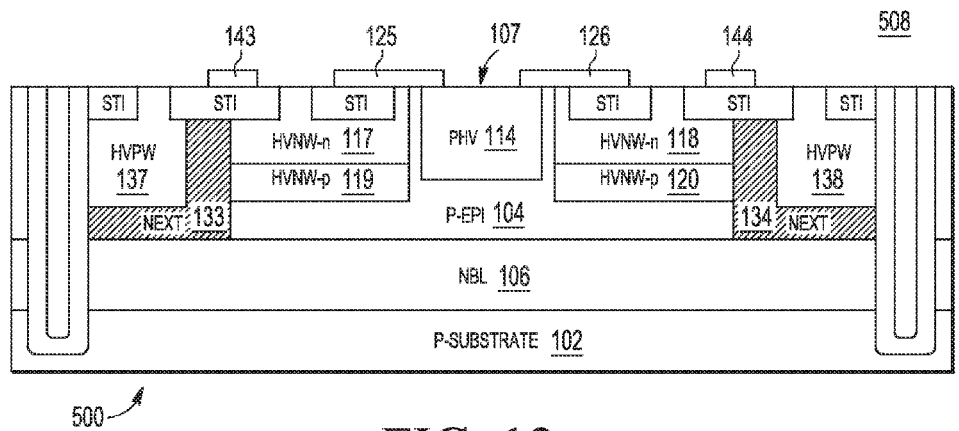

At processing stage 508 of FIG. 12, the mask 528 is removed from the workpiece 500 and the gate structures 125, 126 and the flap structures 143, 144 are formed on, or over, the primary surface 107 of the workpiece 500. The gate structures 125, 126 may be formed using any of a variety of well-known gate fabrication processes. To illustrate, each gate structure may comprise a gate dielectric layer of silicon dioxide, silicon nitride, or other suitable materials, and a gate formed thereon from heavily-doped polysilicon or other suitable conductive material. The components of the gate structures 125, 126 may be formed via masked-deposition processes, a blanket deposition and masked-etch process, or a combination thereof. The flap structures 143, 144 may be formed using the same processes used to form the gate structures 125, 126, and thus may be formed concurrent with the formation of the gate structures 125, 126 and resemble the gate structures 125, 126 in their configuration. Alternatively, the flap structures 143, 144 may be formed using a different set of processes. In either approach, the flap structures 143, 144 include a heavily-doped polysilicon structure or other conductive structure separated from the primary surface 107 via one or more insulative layers.

Figure 13:
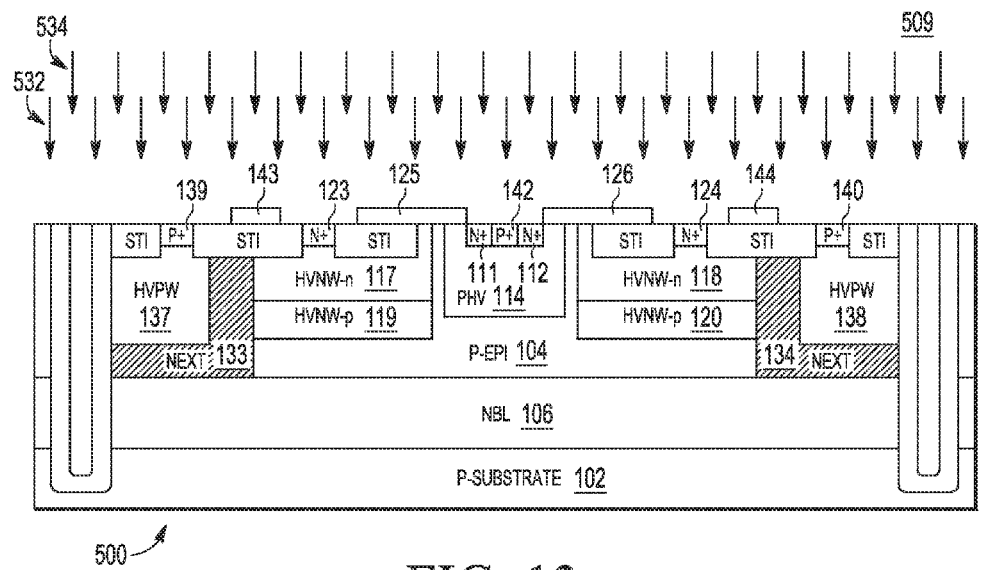

At processing stage 509 of FIG. 13, a salicide block deposition process is performed at the primary surface 107 of the workpiece 500 and then the contact regions 111, 112, 123, 124, 139, 140, 142 are formed via an N-type source/drain (NSD) implantation process 532 and a P-type source/drain (PSD) implantation process 534 performed in either order. Because these processes are performed in the presence of the gate structures 125, 126 and the STI structures, the contact regions may be formed through self-aligned implantation processes and thus may not require the use of masks to properly align the corresponding contact regions.

Figures 14, 15:
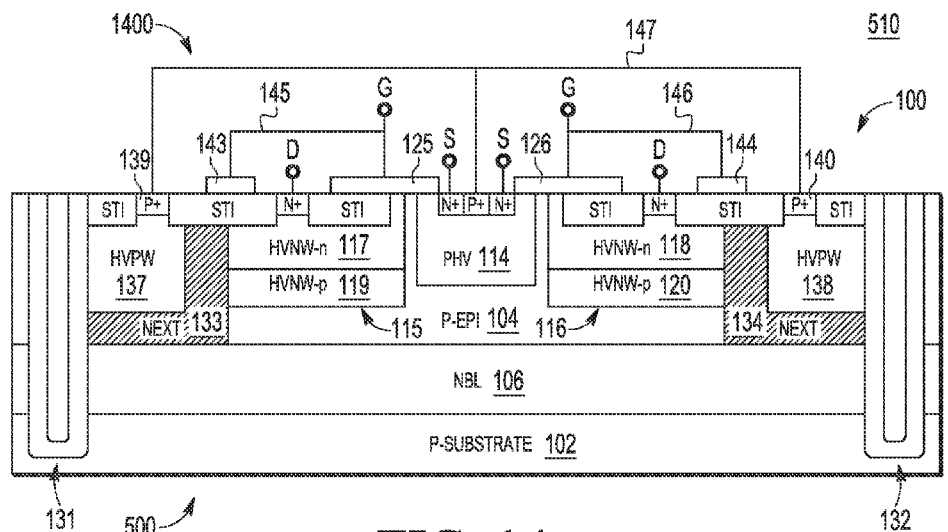
FIGS. 14-18 illustrate a sequence of cross-section views of a workpiece at different stages of a process for fabricating a p-channel LDMOS device in accordance with some embodiments.

At processing stage 510 of FIG. 14, a cobalt silicide layer (not shown) is deposited at the primary surface 107 to ensure reliable contact to the source/drain contact regions and then one or more metal layer deposition and etch processes and inter-layer dielectric formation processes are performed to form the metallization structures 1400 of the device 100, including the metallization structure 147 connecting the p+ contact regions 139, 140 to source/body terminal of the device 100 and the metallization structures 145, 146 connecting the gate structures 125, 126 and the flap structures 143, 144 to the gate terminal of the device 100. A final passivation layer may be formed at the surface of the workpiece 500, completing the illustrated fabrication process for the device 100.

The process of fabricating the device 200 of FIG. 2 is similar to the process described above with reference to FIGS. 5-14. However, in one embodiment, the DTI formation process of processing stage 506 is omitted (if the device 200 does not include DTI structures), and a processing stage in which a high-voltage n-type ion-implantation process is performed after, for example, processing stage 507 so as to form the isolation wells 231, 232 (FIG. 2) at a concentration of, for example, $1 \times 10^{16}$ cm$^{-3}$ to $1 \times 10^{18}$ cm$^{-3}$.

FIGS. 15-18 schematically illustrate, via cross-sectional views, stages in a process for fabricating the LDMOS device 300 from a workpiece 1500 in accordance with at least one embodiment of the present disclosure. For brevity, conventional semiconductor fabrication processes that may be utilized in the fabrication process (e.g., annealing after ion implantation or chemical/mechanical polishing after trench fill) are described only briefly herein, or omitted entirely. Further, although a particular non-limiting sequence of processing stages are described to facilitate understanding, this sequence represents but one example approach to fabricating the LDMOS device 300, and one skilled in the art will appreciate that certain acts may be performed in different orders in view of the teachings provided herein.

The process for forming the LDMOS device 300 may utilize the same initial processing stages 501-503 described above, or initial processing stages similar to the processing stages 501-503. Thus, at stage 1501 illustrated by FIG. 15, the workpiece 1500 has been processed so that the NBL 306, epitaxial layer 304 and NEXT regions 333, 334 have been formed using the same or similar processes as those described above. A high-voltage p-type ion-implantation process 1520 at a concentration, for example, $5 \times 10^{15}$ cm$^{-3}$ to $5 \times 10^{17}$ cm$^{-3}$ is performed in the presence of a mask 1505 to form the extension biasing (HVPW) regions 337, 338 at least partially in the NEXT regions 333, 334, respectively, and to form the HVPW region 314 disposed there between.

Figure 16:
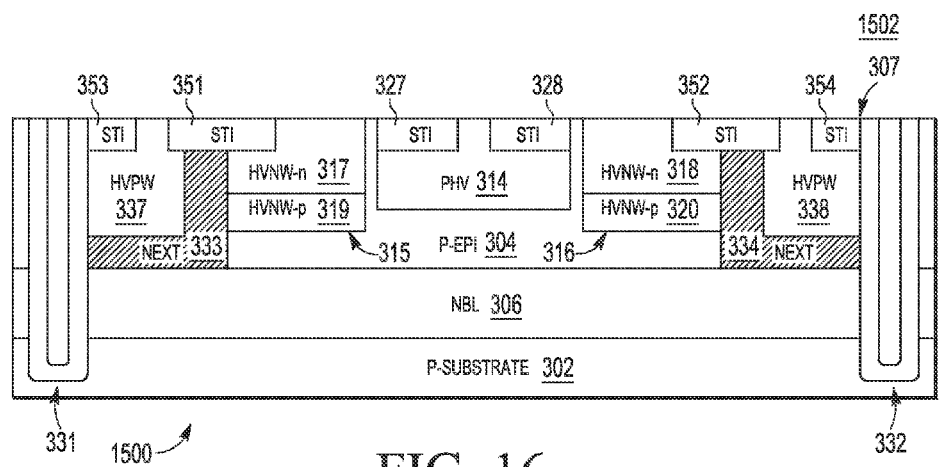
Figure 17:
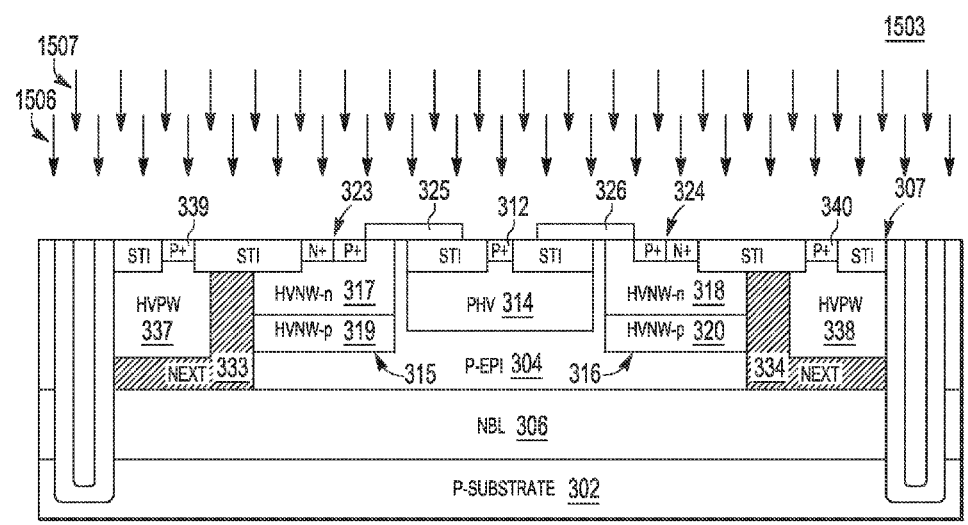

At processing stage 1502 illustrated by FIG. 16, the mask 1505 is removed from the workpiece 1500 and the well regions 315, 316 are formed adjacent to the NEXT regions 333, 334, respectively. The well region 315 includes HVNW-n sub-regions 317 on the top and HVNW-p sub-regions 319 on the bottom. Correspondingly, the well region 316 consists of HVNW-n sub regions 318 and HVNW-p sub regions 320. The DTI structures 331, 332 and the STI structures 327, 328, 351, 352, 353, 354 are formed using similar processes as described above with reference to the processing stage 506 of FIG. 10. At processing stage 1503 of FIG. 17, gate structures 325, 326 are formed on or over the surface 307 of the workpiece 1500 using any of a variety of gate formation processes, and a salicide block deposition process is performed at the surface 307 of the workpiece 1500 and then the contact regions 312, 323, 324, 339, 340 are formed via an NSD implantation process 1506 and a PSD implantation process 1507 performed in either order, as similarly described above with reference to processing stage 509 of FIG. 13. Further, a cobalt silicide layer (not shown) may be deposited at the surface of the workpiece 1500 at this processing stage or at a subsequent processing stage to ensure reliable contact to the source/drain contact regions.

Figure 18:
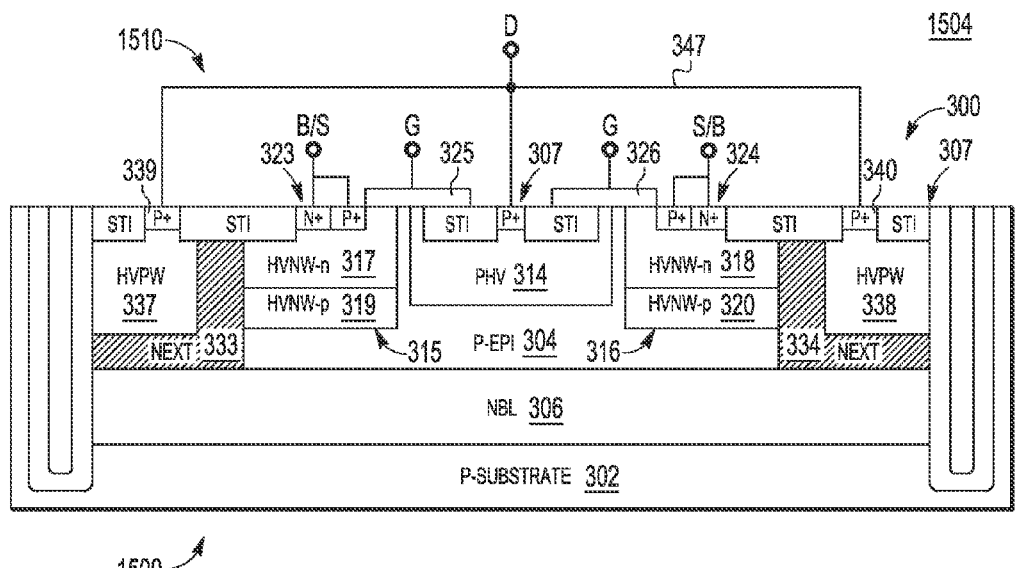

At processing stage 1504 of FIG. 18, one or more metal layer deposition and etch processes and inter-layer dielectric formation processes are performed to form the metallization structures 1510 of the device 300, including the metallization structure 347 connecting the p+ contact regions 339, 340 to the drain terminal of the device 300, metallization structures connecting the gate structures 325, 326 to the gate terminal of the device 100, and metallization structures connecting the source/body contact regions 323, 324 to the source/body terminals. A final passivation may be formed at the surface of the workpiece 500, completing the fabrication process for the device 300.

The process of fabricating the LDMOS device 400 of FIG. 4 is similar to the process described above with reference to the LDMOS device 300. However, in one embodiment, the DTI formation process of processing stage 506 is omitted (if the device 400 does not include DTI structures), and a processing stage in which a high-voltage n-type ion-implantation process is performed after, for example, processing stage 1502 so as to form the isolation wells 431, 432 (FIG. 4) at a concentration of, for example, $1 \times 10^{16}$ cm$^{-3}$ to $1 \times 10^{18}$ cm$^{-3}$.

In accordance with one aspect of the present disclosure, a device includes a semiconductor substrate having a first conductivity type and having a primary surface defining a lateral direction and a buried isolation layer in the semiconductor substrate below the primary surface, the buried isolation layer having a second conductivity type opposite the first conductivity type. The device further includes a first well region in the semiconductor substrate. The first well region includes a first sub-region having the first conductivity type and a second sub-region having the second conductivity type, the second sub-region disposed between the first sub-region and the primary surface, and wherein the first and second sub-regions extend parallel to the primary surface. The device also includes a second well region in the semiconductor substrate and having the first conductivity type and a source region and a drain region at the primary surface of the semiconductor substrate, one of the source region and the drain region disposed in the first well region and the other disposed in the second well region. The device further includes an extension region having the second conductivity type and extending from the primary surface to the buried isolation layer in the semiconductor substrate, the extension region immediately adjacent to the first well region and laterally distal from the second well region and an extension biasing region of the first conductivity type at least partially disposed in the extension region, wherein a portion of the extension region separates the extension biasing region and the first well region and wherein the extension biasing region is electrically coupled to the one of the source region and the drain region disposed outside of the first well region.

In accordance with another aspect of the present disclosure, a method of fabricating a device includes providing a semiconductor substrate having a first conductivity type and having a primary surface defining a lateral direction and forming a buried isolation layer having a second conductivity type in the semiconductor substrate below the primary surface, the second conductivity type opposite the first conductivity type. The method also includes forming a first well region in the semiconductor substrate, the first well region including a first sub-region having the first conductivity type and a second sub-region having the second conductivity type disposed between the first sub-region and the primary surface, and wherein the first and second sub-regions extend parallel to the primary surface. The method further includes forming a second well region in the semiconductor substrate and having the first conductivity type, forming a source region and a drain region at the primary surface of the semiconductor substrate, one of the source region and the drain region disposed in the first well region and the other disposed in the second well region, and forming an extension region of the second conductivity type extending from the primary surface to the buried isolation layer in the semiconductor substrate, the extension region immediately adjacent to the first well region and laterally distal from the second well region. The method additionally includes forming an extension biasing region of the first conductivity type at least partially disposed in the extension region, wherein a portion of the extension region separates the extension biasing region and the first well region and wherein the extension biasing region is electrically coupled to the one of the source region and the drain region disposed outside of the first well region.

In accordance with yet another aspect of the present disclosure, an electronic apparatus includes at least one laterally-diffused metal-oxide-silicon (LDMOS) device. The LDMOS device includes a semiconductor substrate having a first conductivity type and having a primary surface defining a lateral direction, a buried isolation layer having a second conductivity type in the semiconductor substrate below the primary surface, the second conductivity type opposite the first conductivity type, and a first well region in the semiconductor substrate, the first well region including a first sub-region having the first conductivity type and a second sub-region having the second conductivity type disposed between the first sub-region and the primary surface, and wherein the first and second sub-regions extend parallel to the primary surface. The LDMOS device further includes a second well region in the semiconductor substrate and having the first conductivity type, a source region and a drain region at the primary surface of the semiconductor substrate, one of the source region and the drain region disposed in the first well region and the other disposed in the second well region, and an extension region of the second conductivity type extending from the primary surface to the buried isolation layer in the semiconductor substrate, the extension region immediately adjacent to the first well region and laterally distal from the second well region. The LDMOS device also includes an extension biasing region of the first conductivity type at least partially disposed in the extension region, wherein a portion of the extension region separates the extension biasing region and the first well region and wherein the extension biasing region is electrically coupled to the one of the source region and the drain region disposed outside of the first well region.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments.

However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A device comprising:
a semiconductor substrate having a first conductivity type and having a primary surface defining a lateral direction;
a buried isolation layer in the semiconductor substrate below the primary surface, the buried isolation layer having a second conductivity type opposite the first conductivity type;
a first well region in the semiconductor substrate, the first well region including a first sub-region having the first conductivity type and a second sub-region having the second conductivity type, the second sub-region disposed between the first sub-region and the primary surface, and wherein the first and second sub-regions extend parallel to the primary surface;
a second well region in the semiconductor substrate and having the first conductivity type;
a source region and a drain region at the primary surface of the semiconductor substrate, one of the source region and the drain region disposed in the first well region and the other disposed in the second well region;
an extension region having the second conductivity type and extending from the primary surface to the buried isolation layer in the semiconductor substrate, the extension region immediately adjacent to the first well region and laterally distal from the second well region; and
an extension biasing region of the first conductivity type at least partially disposed in the extension region, wherein a portion of the extension region separates the extension biasing region and the first well region and wherein the extension biasing region is electrically coupled to the one of the source region and the drain region disposed outside of the first well region.

2. The device of claim 1, further comprising:
at least one gate structure disposed at the primary surface of the semiconductor substrate, the at least one gate structure partially overlapping at least one of the first and second well regions.

3. The device of claim 1, further comprising:
a deep trench isolation (DTI) structure extending into the semiconductor substrate from the primary surface at a location that is laterally distal from the first and second well regions.

4. The device of claim 1, further comprising:
an isolation well having the second conductivity type in the semiconductor substrate, the isolation well extending from the primary surface to the buried isolation layer at a location that is laterally distal from the first and second well regions.

5. The device of claim 1, wherein:
the first conductivity type is a p-type conductivity; and
the second conductivity type is an n-type conductivity.

6. The device of claim 1, wherein:
the drain region is disposed in the first well region and the source region is disposed in the second well region.

7. The device of claim 6, further comprising:
at least one gate structure disposed at the primary surface of the semiconductor substrate, the at least one gate structure partially overlapping at least one of the first and second well regions.

8. The device of claim 7, further comprising:
a conductive flap structure disposed at the primary surface of the semiconductor substrate, the flap structure disposed above a junction between the first well region and the extension region and electrically coupled to the gate structure.

9. The device of claim 1, wherein:
the source region is disposed in the first well region and the drain region is disposed in the second well region.

10. The device of claim 9, further comprising:
at least one gate structure disposed at the primary surface of the semiconductor substrate, the at least one gate structure partially overlapping at least one of the first and second well regions.

11. A method of fabricating a device, the method comprising:
providing a semiconductor substrate having a first conductivity type and having a primary surface defining a lateral direction;
forming a buried isolation layer having a second conductivity type in the semiconductor substrate below the primary surface, the second conductivity type opposite the first conductivity type;
forming a first well region in the semiconductor substrate, the first well region including a first sub-region having the first conductivity type and a second sub-region having the second conductivity type disposed between the first sub-region and the primary surface, and wherein the first and second sub-regions extend parallel to the primary surface;
forming a second well region in the semiconductor substrate and having the first conductivity type;
forming a source region and a drain region at the primary surface of the semiconductor substrate, one of the source region and the drain region disposed in the first well region and the other disposed in the second well region;
forming an extension region of the second conductivity type extending from the primary surface to the buried isolation layer in the semiconductor substrate, the extension region immediately adjacent to the first well region and laterally distal from the second well region; and
forming an extension biasing region of the first conductivity type at least partially disposed in the extension region, wherein a portion of the extension region separates the extension biasing region and the first well region and wherein the extension biasing region is electrically coupled to the one of the source region and the drain region disposed outside of the first well region.

12. The method of claim 11, further comprising:
forming at least one gate structure disposed at the primary surface of the semiconductor substrate, the at least one gate structure(s) partially overlapping at least one of the first and second well regions.

13. The method of claim 11, further comprising:
forming a deep trench isolation (DTI) structure extending into the semiconductor substrate from the primary surface at a location that is laterally distal from the first and second well regions.

14. The method of claim 11, further comprising:
forming an isolation well having the second conductivity type in the semiconductor substrate, the isolation well extending from the primary surface to the buried isolation layer at a location that is laterally distal from the first and second well regions.

15. The method of claim 11, wherein:
the first conductivity type is a p-type conductivity; and
the second conductivity type is an n-type conductivity.

16. The method of claim 11, wherein:
forming the source region and the drain region comprises:
forming the drain region in the first well region; and
forming the source region in the second well region.

17. The method of claim 16, further comprising:
forming at least one gate structure disposed at the primary surface of the semiconductor substrate, the at least one gate structure partially overlapping at least one of the first and second well regions.

18. The method of claim 17, further comprising:
forming a conductive flap structure disposed at the primary surface of the semiconductor substrate, the flap structure disposed above a junction between the first well region and the extension region and electrically coupled to the gate structure.

19. The method of claim 11, wherein:
forming the source region and the drain region comprises:
forming the source region in the first well region; and
forming the drain region in the second well region.

20. An electronic apparatus comprising:
at least one laterally-diffused metal-oxide-silicon (LDMOS) device, the LDMOS device comprising:
 a semiconductor substrate having a first conductivity type and having a primary surface defining a lateral direction;
 a buried isolation layer having a second conductivity type in the semiconductor substrate below the primary surface, the second conductivity type opposite the first conductivity type;
 a first well region in the semiconductor substrate, the first well region including a first sub-region having the first conductivity type and a second sub-region having the second conductivity type disposed between the first sub-region and the primary surface, and wherein the first and second sub-regions extend parallel to the primary surface;
 a second well region in the semiconductor substrate and having the first conductivity type;
 a source region and a drain region at the primary surface of the semiconductor substrate, one of the source region and the drain region disposed in the first well region and the other disposed in the second well region;
 an extension region of the second conductivity type extending from the primary surface to the buried isolation layer in the semiconductor substrate, the extension region immediately adjacent to the first well region and laterally distal from the second well region; and
 an extension biasing region of the first conductivity type at least partially disposed in the extension region, wherein a portion of the extension region separates the extension biasing region and the first well region and wherein the extension biasing region is electrically coupled to the one of the source region and the drain region disposed outside of the first well region.

\* \* \* \* \*